United States Patent [19]

Ugurbil et al.

[11] Patent Number: 4,947,119
[45] Date of Patent: Aug. 7, 1990

[54] MAGNETIC RESONANCE IMAGING AND SPECTROSCOPY METHODS

[75] Inventors: Kamil Ugurbil, Maple Plain; Michael Garwood, Minneapolis, both of Minn.

[73] Assignee: University of Minnesota, Minneapolis, Minn.

[21] Appl. No.: 394,237

[22] Filed: Aug. 14, 1989

Related U.S. Application Data

[63] Continuation-in-part of Ser. No. 209,533, Jun. 21, 1988, abandoned.

[51] Int. Cl.$^5$ ............................................. G01R 33/20
[52] U.S. Cl. ..................................... 324/307; 324/300
[58] Field of Search ............... 324/300, 307, 308, 309, 324/310, 311, 312, 313

[56] References Cited

U.S. PATENT DOCUMENTS

| | | | |
|---|---|---|---|
| 4,390,840 | 6/1983 | Ganssen | 324/309 |
| 4,390,940 | 6/1983 | Ganssen et al. | |
| 4,480,228 | 10/1984 | Bottomley | 324/309 |
| 4,486,709 | 12/1984 | Bendall | |
| 4,528,508 | 7/1985 | Vail, III | |
| 4,535,290 | 8/1985 | Post et al. | |
| 4,551,680 | 11/1985 | Macovski | 324/309 |
| 4,695,799 | 9/1987 | Hardy et al. | 324/309 |
| 4,744,466 | 9/1988 | Sattin | |
| 4,820,983 | 4/1989 | Bendall | |

FOREIGN PATENT DOCUMENTS

| | | |
|---|---|---|
| 0170508 | 7/1985 | European Pat. Off. |
| 0206129 | 6/1986 | European Pat. Off. |
| 0229228 | 10/1986 | European Pat. Off. |
| WO87/03370 | 11/1986 | PCT Int'l Appl. |
| WO88/07673 | 3/1988 | PCT Int'l Appl. |

OTHER PUBLICATIONS

D. G. Norris and A. Haase, "Variable Excitation Angle AFP Pulses", *Magnetic Resonance in Medicine*, 9, pp. 435–440, (1989).

"Solvent Suppression in Fourier Transform Nuclear Magnetic Resonance", P. J. Hore, *Journal of Magnetic Resonance*, vol. 55, p. 383, (1983).

"Volume-Selective Excitation. A Novel Approach to Topical NMR", W. P. Aue et al., *Journal of Magnetic Resonance*, vol. 56, pp. 350–354, (1984).

"Depth-Resolved Surface-Coil Spectroscopy (DRESS) for in Vivo $^1$H, $^{31}$P, and $^{13}$C NMR", Paul A. Bottomley et al., *Journal of Magnetic Resonance*, vol. 59, pp. 338–342, (1984).

"Communications: Toward Biochemical Imaging", S. J. Cox and P. Styles, *Journal of Magnetic Resonance*, vol. 40, pp. 209–212, (1980).

"Broadband Population Inversion by Phase Modulated Pulses", J. Baum, R. Tycko, and A. Pines, *Journal of Chemical Physics*, vol. 79, p. 4643, (1983).

"Spatial Localization of High Resolution $^{31}$P Spectra with a Surface Coil", Axel Haase et al., *Journal of Magnetic Resonance*, vol. 55, pp. 164–169, (1983).

"Rotating Frame Zeugmatography", D. I. Hoult, *Journal of Magnetic Resonance*, vol. 33, pp. 183–197, (1979).

"Principles of Magnetic Resonance", C. P. Slichter, 2nd ed., p. 24, Springer-Verlag, Berlin/New York, 1979.

"Mapping of Metabolites in Whole Animals by $^{31}$P NMR Using Surface Coils", Joseph J. H. Ackerman et al., *Nature*, vol. 283, pp. 167–170, (Jan. 10, 1980).

"Uniform Sample Excitation with Surface Coils for in Vivo Spectroscopy by Adiabatic Rapid Half Passage", M. Robin Bendall and David T. Pegg, *Journal of Magnetic Resonance*, vol. 67, pp. 376–381, (1986).

"Improved Selective 180° Radiofrequency Pulses for Magnetization Inversion and Phase Reversal", Hong Yan and John C. Gore, *Journal of Magnetic Resonance*, vol. 71, pp. 116–131, (1987).

(List continued on next page.)

*Primary Examiner*—Michael J. Tokar

[57] ABSTRACT

Several magnetic resonance imaging (MRI) methods using adiabatic excitation are disclosed. One method accomplishes slice selection with gradient modulated adiabatic excitation. Another method employs slice selection with adiabatic excitation despite large variations in $B_1$ magnitude. There is also described $^1$H spectroscopy using solvent suppressive adiabatic pulses.

11 Claims, 2 Drawing Sheets

OTHER PUBLICATIONS

"Image-Selected in Vivo Spectroscopy (ISIS), A New Technique for Spatially Selective NMR Spectroscopy", R. J. Ordidge et al., *Journal of Magnetic Resonance*, vol. 66, pp. 283-294, (1986).

"Solvent-Suppressed Spatially Resolved Spectroscopy, An Approach to High-Resolution NMR on a Whole-Body MR System", Peter R. Luyten et al., *Journal of Magnetic Resonance*, vol. 67, pp. 148-155, (1986).

"Magnetic Resonance Imaging with Adiabatic Pulses Using a Single Surface Coil for RF Transmission and Signal Detection", M. Garwood, K. Ugurbil, A. Rath, M. R. Bendall, B. Ross, S. Mitchell, and H. Merkle, *Magnetic Resonance in Medicine*, vol. 9, pp. 25-34, (Jan. 1989).

"Slice Selection with Gradient-Modulated Adiabatic Excitation Despite the Presence of Large $B_1$ Inhomogeneities", A. Johnson, M. Garwood, and K. Ugurbil, *Journal of Magnetic Resonance*, vol. 81, pp. 653-660, (1989).

"Slice Selection with Adiabatic Excitation Despite Large Variations in $B_1$ Magnitude", A. J. Johnson, K. Ugurbil, and M. Garwood, Abstract submitted for Seventh Annual Meeting of the Society of Magnetic Resonance in Medicine, (Aug. 20, 1988).

"Slice Selection with Gradient Modulated Adiabatic Excitation", A. J. Johnson, M. Garwood, and K. Ugurbil, Abstract submitted for Seventh Annual Meeting of the Society of Magnetic Resonance in Medicine, (Aug. 20, 1988).

"Slice Selection with an Adiabatic Half-Passage Pulse Which is Insensitive to RF Inhomogeneity", M. Garwood, A. J. Johnson, H. Merkle, and K. Ugurbil, Abstracts, Second European Congress of NMR in Medicine and Biology, Berlin, p. 40, (Jun. 23, 1988).

"$^1$H Spectroscopy Using Solvent Suppressive Adiabatic Pulses (SSAP)", M. Garwood, B. D. Ross, S. L. Mitchell, K. Hendrich, and H. Merkle, Abstract submitted for Seventh Annual Meeting of the Society of Magnetic Resonance in Medicine, (Aug. 20, 1988).

"Amplitude and Frequency/Phase Modulated Refocusing Pulses that Induce Plane Rotations Even in the Presence of Inhomogeneous $B_1$ Fields", K. Ugurbil, M. Garwood, A. Rath, and M. R. Bendall, *Journal of Magnetic Resonance*, vol. 78, pp. 472-497, (Aug. 1988).

"Optimization of Modulation Functions to Improve Insensitivity of Adiabatic Pulses to Variations in $B_1$ Magnitude", K. Ugurbil, M. Garwood, and A. Rath, *Journal of Magnetic Resonance*, vol. 80, pp. 448-469, (Dec. 1988).

"Amplitude and Frequency Modulated Pulses to Achieve 90° Plane Rotations with Inhomogeneous $B_1$ Fields", K. Ugurbil, M. Garwood, and M. R. Bendall, *Journal of Magnetic Resonance*, vol. 72, pp. 177-185, (Mar. 1987).

"Communications: Adiabatic Refocusing Pulse which Compensates for Variable rf Power and Off-Resonance Effects", M. R. Bendall, M. Garwood, K. Ugurbil, and D. T. Pegg, *Magnetic Resonance in Medicine*, vol. 4, pp. 493-499, (May 1987).

"A Method for Localizing High-Resolution NMR Spectra from Human Subjects", Peter Styles et al., *Magnetic Resonance in Medicine*, vol. 2, pp. 402-409, (1985).

"NMR Imaging and Spectroscopic Techniques in Biology and Medicine", Randall Rue, *HPA Bulletin*, pp. 19-27, (Dec. 1985).

"Highly Selective $\pi/2$ and $\pi$ Pulse Generation", M. S. Silver et al., *Journal of Magnetic Resonance*, vol. 59, pp. 347-351, (1984).

"Selective Spin Inversion in Nuclear Magnetic Resonance and Coherent Optics Through and Exact Solution of the Bloch-Riccati Equation", M. S. Silver et al., *Physical Review*, vol. 31, No. 4, (Apr. 1985).

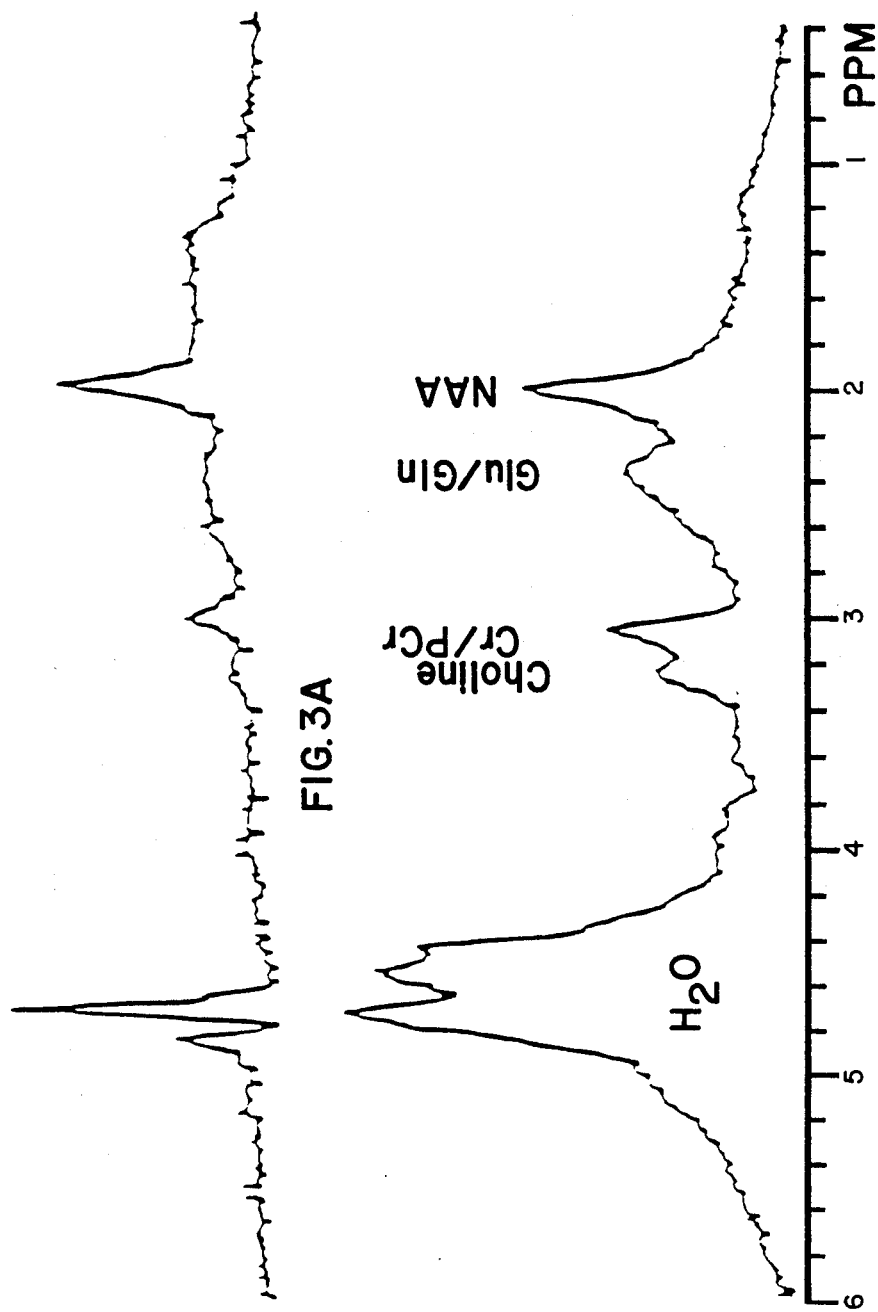

MAGNETIC RESONANCE IMAGING AND SPECTROSCOPY METHODS

This is a continuation-in-part of application Ser. No. 209,533, filed Jun. 21, 1988, now abandoned.

TECHNICAL FIELD OF THE INVENTION

The present invention relates generally to spectroscopy, and more particularly to methods for slice selection and solvent suppression using adiabatic excitation.

BACKGROUND OF THE INVENTION

Magnetic resonance imaging (MRI) is now an important imaging technique in medicine. There are described herein several MRI methods using adiabatic excitation. One method accomplishes slice selection with gradient modulated adiabatic excitation. Another method employs slice selection with adiabatic excitation despite large variations in $B_1$ magnitude. There is also described $^1H$ spectroscopy using solvent suppressive adiabatic pulses. The methods described herein relate to the adiabatic pulses and methods described in U.S. patent application Ser. No. 032,059, entitled "Amplitude and Frequency/Phase Modulated Pulses to Achieve Plane Rotations of Nuclear Spin Magnetization Vectors, with Inhomogeneous $B_1$ Fields", the entire disclosure of which is hereby incorporated by reference herein.

BRIEF DESCRIPTION OF THE DRAWINGS

FIG. 3A is a plot of signal-to-noise obtained with Solvent Suppressive Adiabatic Pulses;

FIG. 3B is a plot of signal-to-noise obtained with binomial pulses.

DETAILED DESCRIPTION OF THE INVENTION

SLICE SELECTION WITH GRADIENT MODULATED ADIABATIC EXCITATION

Because of their extreme tolerance to RF inhomogeneity, frequency selective adiabatic inversion pulses are becoming increasingly popular for localized spectroscopic and imaging studies carried out with surface coils. They offer superior slice definition and do not suffer from sensitivity loss caused by non-uniform spin excitation, a problem inherent with conventional pulses. With frequency selective $B_1$ insensitive inversion pulses, slice selection is achieved by applying the pulse in the presence of a constant $B_0$ gradient field while the pulse amplitude and frequency (or phase) are modulated. We describe here a new gradient modulated adiabatic excitation pulse (GMAX) which, in addition to amplitude and frequency modulation, employs timedependent gradient modulation in order to achieve slice selective excitation.

Figure 1:
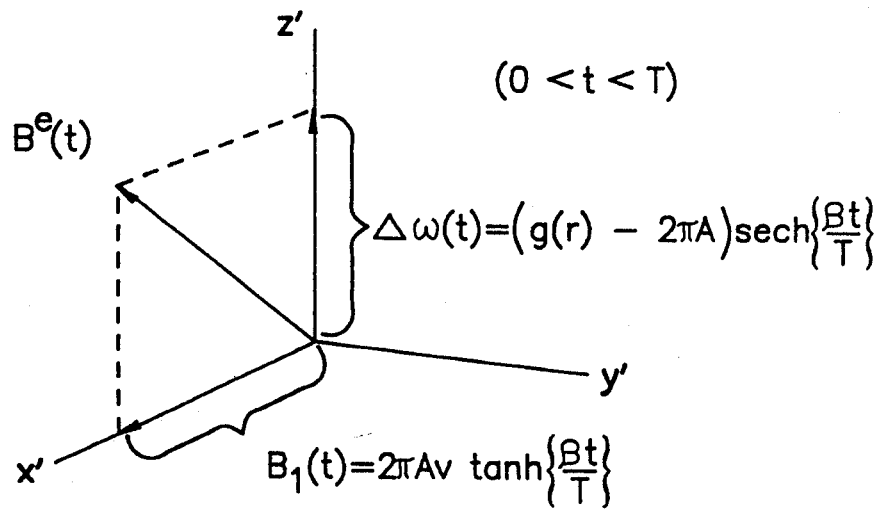
FIG. 1 is a plot of $B^e(t)$ generated by a simple version of GMAX consisting of tanh modulated $B_1$ amplitude, and sech modulated pulse frequency and gradient magnitude.

To clearly illustrate the principles of GMAX, consider a frame of reference (axes x', y', z') precessing at the instantaneous frequency of the pulse. Under ideal adiabatic conditions, motion of the initial longitudinal magnetization will parallel the trajectory of the effective field $B^e(t)$, which is defined in this frame by the vectorial sum of $B_1(t)$ and $\Delta\omega(t)$. $B_1(t)$ is RF amplitude in rads/sec and $\Delta\omega(t)$ equals the difference between the instantaneous pulse and spin frequencies (rads/sec). FIG. 1 shows $B^e(t)$ generated by a simple version of GMAX consisting of tanh modulated $B_1$ amplitude, and sech modulated pulse frequency and gradient magnitude. The terms A, v, T, and $\beta$ are, respectively, pulse frequency modulation amplitude (in Hz), a unitless term accounting for spatial variation in $B_1$ magnitude, pulse duration, and the limit of modulation. The quantity g(r) in the expression for $\Delta\omega(t)$ represents the maximum $B_0$ gradient strength (rads/sec) as a function of position, r.

Figure 2:
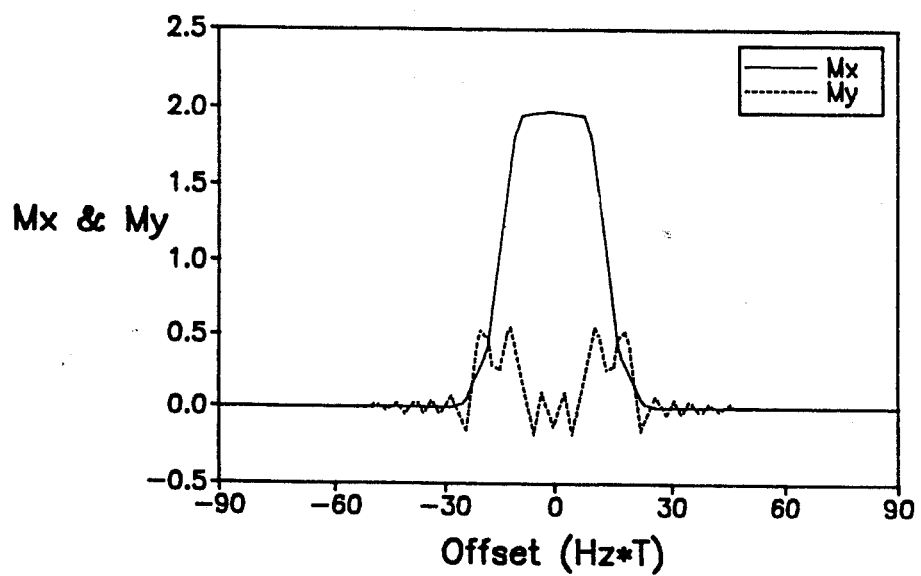
FIG. 2 is a plot of a computer calculated slice profile obtained with the tanh/sech version of GMAX.

Unlike adiabatic inversion (Silver, M. S., R. I. Joseph, and D. I. Hoult, J. Magn. Reson. 59,347,1984) or excitation (Johnson, A. J., K. Ugurbil, and M. Garwood. Abstract submitted for 7th Annual Society of Magnetic Resonance in Medicine meeting, 1988) pulses where the field gradient is time-invariant, GMAX creates a gradient-dependent node in $\Delta\omega(t)$ by executing equivalent time modulation of both pulse frequency and $B_0$ gradient strength. This node exists in a plane lying perpendicular to the gradient direction in a region where the field gradient magnitude exactly equals the pulse frequency amplitude, i.e. when $g(r)=2\pi A$. Since $\Delta\omega(t)$ will be positive on one side of this plane and negative on the other, the final transverse magnetization on opposite sides will differ in phase by 180°. A second implementation of GMAX with reversed gradient modulation yields a mirror image of the first response reflected about a point where the gradient modulation is zero. Addition of these two signals defines a slice of excitation of width $4\pi A$. Slice position and width can be varied by manipulating A and/or gradient magnitude. By repeating this sequence with three orthogonal field gradients, 3-dimensional localization can be achieved in a manner analogous to 3-dimensional ISIS (Ordidge, R. J., A. Connelly, and J. A. B. Lohman. J. Magn. Reson. 66, 283, 1986). FIG. 2 shows a computer calculated slice profile obtained with the tanh/sech version of GMAX, $\beta=5.3$.

Although the included example of GMAX consists of a tanh/sech modulation pair, other functions can be used provided the boundary conditions remain unchanged; specifically, numerically optimized modulation schemes can be used to enhance the pulse with respect to offresonance performance and $B_1$ insensitivity (Ugurbil, K., M. Garwood, and A. Rath J. Magn. Reson. in press, 1988). The Silver, Johnson, Ordidge and Ugurbil references specified above are hereby incorporated by reference herein.

SLICE SELECTION WITH ADIABATIC EXCITATION DESPITE LARGE VARIATIONS IN $B_1$ MAGNITUDE

Frequency selective excitation pulses used in NMR imaging and spectroscopy are $B_1$ sensitive and cannot induce uniform excitation or maintain a uniform slice profile in the presence of large variation in $B_1$ magnitude. Consequently, in surface coil studies using these pulses, it is virtually impossible to select a distortion free slice that is perpendicular to the plane of the surface coil. The only methods capable of defining uniform slices over large variations in $B_1$ have relied on adiabatic inversion (Silver, M. S., R. I. Joseph, and D. I. Hoult, J. Magn. Reson. 59, 347, 1984) or excitation (Johnson, A. J., M. Garwood, and K. Ugurbil. Abstract submitted for 7th Annual Society of Magnetic Resonance in Medicine meeting, 1988) pulses that require the addition of two separate acquisitions. These pulses are unsuitable for multislice imaging or spectroscopic and imaging studies in the presence of motion. Here, we report a new adiabatic excitation pulse that is both slice selective and $B_1$ insensitive and does not require multiple acquisitions.

Described in terms of amplitude and frequency modulation, this slice selective adiabatic excitation or SSAX pulse consists of two functionally distinct but contiguous segments. The initial segment combines constant or modulated $B_1$ amplitude with a large frequency sweep; the subsequent segment couples decaying $B_1$ amplitude with zero frequency modulation. Taking $B_1$ to be along x′ in a reference frame which rotates at the instantaneous frequency of the pulse (axes x′, y′, and z′), the effect of SSAX can be visualized as follows: SSAX first creates a distribution of spin orientations in the x′z′ plane as a function of frequency offset so that only spins with zero offset point along x′. Subsequently, spins not along x′ are taken either back up to z′ (positive offset) or down to −z′ (negative offset) whereas those along x′ (zero offset) are allowed to remain in the transverse plane. The SSAX pulse is applied to a sample under the influence of a constant gradient $B_0$ field which is achieved by superimposing a constant $B_0$ gradient field on a constant uniform $B_0$ field. This provides that the precessional frequency of spins in the sample vary with spatial location.

For illustrative purposes, the following example is a simple version of a SSAX pulse constructed with tangent and sech functions and with constant $B_1$ amplitude in the first segment.

$$B_1(t) = 2\pi A v$$

$$\Delta\omega(t) = 2\pi A \tan\left\{\frac{\pi q}{T}\left(\frac{T}{2} - t\right)\right\}\left(0 < t < \frac{T}{2}\right)$$

$$B_1(t) = 2\pi A v \, \text{sech}\left\{\frac{2\beta}{T}\left(t - \frac{T}{2}\right)\right\}\left(\frac{T}{2} < t < T\right)$$

$$\Delta\omega(t) = 0$$

$B_1$ is RF amplitude in rads/sec, $\Delta\omega$ is the difference between the instantaneous pulse and spin Larmor frequencies in rads/sec, $A^*\tan[\pi q/2]$ is the frequency modulation amplitude in Hz, v is a unitless parameter equal to the (peak $B_1$)/$2\pi A$ ratio, T is pulse duration, and q and $\beta$ are chosen to set the modulation limits. When $B_1$ is inhomogeneous, both $B_1$ and v depend on spatial coordinates. To complete signal acquisition after the application of the SSAX pulse the $B_0$ gradient is reversed (i.e. at each location $B_0$ becomes negative of its initial value) and is maintained reversed sufficiently long to rephase spins dephased by SSAX. Next, the superimposed $B_0$ gradient is turned off and the NMR signal is either acquired immediately, after a refocusing pulse is applied, or as gradient recalled echo.

While the above example is written using tan and sech functions, provided the boundary values remain the same, other modulation schemes can be used; in particular, numerically optimized modulation routines can be used to improve off-resonance performance and $B_1$ insensitivity of the pulse (Ugurbil, K., M. Garwood, and A. Rath. *J. Magn. Reson.* in press, 1988).

Projected applications include combining SSAX with a single adiabatic spin excitation to achieve solvent suppression while exciting other frequencies, combining two SSAX pulses with a 90° adiabatic rotation from the x′y′ plane to the z′ axis to define a 2-dimensional column of excitation in one pulse train. Similarly, three SSAX pulses can be combined with two 90° adiabatic rotations to define in a single pulse train a 3-dimensional volume of excitation which can be used in spectroscopic localization. The slice profile of the current version of this pulse is not square. However, there are no $B_1$ insensitive and slice selective pulses which do not require multiple acquisitions. Therefore, this pulse would be preferred in all applications in the presence of inhomogeneous $B_1$'s where multislice capability is desired, motion is present, and/or subtraction errors are significant. The disclosures of the abovespecified Silver, Johnson and Ugurbil references are hereby incorporated by reference herein.

¹H SPECTROSCOPY USING SOLVENT SUPPRESSIVE ADIABATIC PULSES (SSAP)

In vivo ¹H NMR spectroscopy is usually executed with surface coils, which provide enhanced sensitivity for most applications although the $B_1$ field is extremely inhomogeneous. Pulse sequences designed to selectively suppress the $H_2O$ signal have been based on RF pulses which are sensitive to variations in $B_1$ magnitude (P. J. Hore. J.Magn. Reson. 55, 383(1983)). When using surface coils to transmit rectangular or amplitude modulated pulses, sample regions inevitably experience nutation angles, $\theta$, that are multiples of 180°, and signals arising in regions where $\theta = 90°$ may be partially cancelled by signals produced where $\theta = 270°$. In addition, the frequency response of such pulses depends upon $\theta$, and is therefore a function of spatial coordinates when inhomogeneous RF coils are employed for RF transmission.

Recently, we described amplitude and frequency/-phase modulated pulses which are highly insensitive to $B_1$ inhomogeneity and can achieve uniform 90° (K. Ugurbil, M. Garwood, and M. R. Bendall, J. Magn. Reson. 72, 177(1987)) and 180° (M. R. Bendall, M. Garwood, K. Ugurbil, and D. T. Pegg, *Magn. Reson. Med.* 4, 498(1987), K. Ugurbil, M. Garwood, A. R. Rath, and M. R. Bendall, *J. Magn. Reson.*, in press) plane rotations across the surface coil active volume provided the adiabatic condition (i.e., $|Be/(d\alpha/dt)| >> 1$) is satisfied throughout the pulse. These pulses are composed of segments during which the effective field, $B^e$, rotates 90° with respect to a frame rotating with the instantaneous frequency of the pulse. The 90° and 180° plane rotation pulses, BIR-2 and BIREF-1, are composed of 4 and 2 such segments, respectively. When a delay period, $\tau$, equal to $\frac{1}{4}v$ is placed between the first and second 90° segments of BIR-2, spins with precessional frequencies equal to $\pm nv$ are returned to the z′-axis at the end of the pulse, where n is an odd integer and v is the frequency offset (in Hz) in the rotating frame. Likewise, spins with frequencies equal to $\pm nv$ do not refocus when a delay period equal to $\frac{1}{2}v$ is placed in the middle of refocusing pulse BIREF-1. Consequently, pulses BIR-2 and BIREF-1 can be modified to achieve solvent suppression, where the frequency response ($\cos(2\pi v\tau)$ and $\cos(\pi v\tau)$, respectively) and spatial dependence are highly invariant across a wide range of $B_1$ magnitude.

BIR-2 and BIREF-1 solvent suppressive adiabatic pulses (SSAP) were used for excitation and refocusing in a spin echo sequence to obtain in vivo ¹H spectra of rat brain. Spectra were acquired using a GE CSI-II spectrometer equipped with a 40 cm, 4.7 T magnet. An 8 mm diameter surface coil placed over the rat head was used. $\tau$ was adjusted to produce a null at the H$_2$O resonance and yield maximal signal 500 Hz either side of H$_2$O. FIG. 3A shows the results obtained with SSAP after 48 scans using a repetition time of 2 sec and an echo time (TE) of 136 msec. For comparison, FIG. 3B shows the results obtained from the same animal using a spin echo with binominal pulses 1-3-3-1 and 2-6-6-2 (P. J. Hore *J. Magn. Reson.* 55, 383(1983)). For this latter experiment, the pulse lengths were adjusted so that the cumulative excitation flip angle equaled 135° on resonance at the coil center. All other parameters remained constant. Because adiabatic pulses can uniformly excite spins throughout the surface coil active volume, the spectral signal-to-noise obtained with SSAP (FIG. 3A) was increased relative to that obtained with the binomial pulses (FIG. 3B). The disclosures of the abovespecified Bendall, Hore and two Ugurbil references are hereby incorporated by reference herein.

The principles introduced with the solvent suppressive adiabatic pulses are applicable to any pulse, such as a composite pulse, where the spin rotation induced by the pulse is determined by the magnitude of one or more discontinuous phase shifts within the pulse. By replacing the phase shift(s) with a delay, the required phase shifts can be attained by means of offresonance spins precessing in the transverse plane. At the end of the delay, the phase of B$_1$ relative to the spins will change by $(360)\Delta v\tau$ degrees, where $\tau$ is the duration of the delay and $\Delta v$ is the resonance offset in Hz. These spins will then undergo a plane rotation through an angle appropriate for a discontinuous phase shift of $360\Delta v\tau$.

Although the invention has been described herein in its preferred form those skilled in the art will readily recognize that many modifications and changes may be made thereto without departing from the spirit and scope of the claims appended thereto.

What is claimed is:

1. A method of slice selective excitation of a sample under the influence of a spin aligning constant B$_0$ gradient field comprising the steps of:
   (a) providing a coil proximate said sample; and
   (b) exciting said coil to produce an adiabatic excitation pulse to apply a B$_1$ field to said sample, said pulse generated to include an initial segment including a frequency sweep to cause the spins in said sample to rotate away from alignment with the B$_0$ field according to their resonance frequency within the B$_0$ gradient field, and a subsequent segment having a decaying B$_1$ amplitude with zero frequency modulation, said B$_1$ amplitude decaying according to a predetermined function to provide optimal B$_1$ insensitivity by spin-locking over as large a variation of B$_1$ magnitude as possible.

2. A method for slice selective excitation and signal acquisition for a sample under the influence of a spin aligning constant B$_0$ field comprising the steps of:
   (a) superimposing an amplitude modulated B$_0$ gradient field on said constant B$_0$ field and simultaneously applying an adiabatic excitation pulse to the sample to generate a B$_1$ field in said sample according to a modulation scheme wherein the frequency of said pulse is modulated with the same time dependence as the amplitude of said gradient field to create a spatially dependent node $\Delta w(t)$ in a region of the sample where the B$_0$ gradient magnitude (in frequency units) exactly equals the pulse frequency, and further wherein the amplitude of said pulse is modulated to achieve insensitivity to B$_1$ magnitude wherein $\Delta w(t)$ equals the difference between the instantaneous frequency of the pulse and the spin frequencies of the matter in the sample;
   (b) acquiring a first NMR signal response;
   (c) repeating step (a) but with the modulation scheme adapted to excite said sample to produce a mirror image of the first NMR response reflected about a point where the gradient modulation is zero;
   (d) acquiring said mirror image NMR signal response; and
   (e) adding the first response to the mirror image response to define the selected slice.

3. A method according to claim 2 wherein the slice position and width are varied by manipulating the amplitude of the RF frequency modulation function and/or the B$_0$ gradient amplitude.

4. A method for executing a frequency dependent plane rotation of magnetic spins in a sample under the influence of a spin aligning magnetic field B$_0$, comprising the steps of:
   (a) providing a coil responsive to electrical energization to generate a B$_1$ field;
   (b) orienting said coil so that the B$_1$ field generated by the coil has components transverse to said B$_0$ field; and
   (c) energizing said coil to generate an adiabatic pulse which achieves a plane rotation of said spins by flipping the effective field B$^e$ during said pulse and which includes a predetermined delay between segments thereof to permit selected spins having a certain Larmor frequency to precess about said B$_0$ field a certain angle to realign them relative to the B$_1$ field so that they will undergo a plane rotation of a degree corresponding to said certain angle and wherein the spins having other than said certain Lamor frequency are subjected to plane rotations corresponding to the angle they have precessed during said delay so that a frequency dependent variable degree rotation is achieved.

5. A method for executing a frequency dependent plane rotation of selected magnetic spins in a sample under the influence of a spin aligning magnetic field B$_0$ comprising the steps of:
   (a) providing a coil responsive to electrical energization to generate a B$_1$ field;
   (b) orienting said coil so that the B$_1$ field generated by said coil has components transverse to said B$_0$ field; and
   (c) energizing said coil to generate an RF adiabatic pulse which achieves a plane rotation of said spins by flipping the effective field B$^e$ during said pulse and which includes a delay between segments thereof of a duration permitting spins having a certain Larmor frequency to precess about said B$_0$ field through a certain angle aligning them in a position at the end of said delay relative to said B$_1$ field which prevents them for undergoing said plane rotation and instead causing them to be returned to their initial alignment prior to said pulse so that a spin selective plane rotation is achieved.

6. A method for executing a frequency dependent plane rotation of selected magnetic spins in a sample under the influence of a spin aligning magnetic field B$_0$ comprising the steps of:
   (a) providing a coil responsive to electrical energization to generate a B$_1$ field;

(b) orienting said coil so that the $B_1$ field generated by said coil has components transverse to said $B_0$ field; and (c) energizing said coil to provide an adiabatic pulse which achieves a plane rotation of said spins by flipping the effective field $B^e$ during said pulse and which includes at least two segments between which there is a delay allowing spins to precess to a new alignment under the influence of said $B_0$ field so that spins having a certain alignment relative to the $B_1$ field at the beginning of the segment following said delay undergo a plane rotation of a corresponding certain angle and spins which have other than said certain alignment are subjected to plane rotations of degrees corresponding to the angle they have precessed during said delay.

7. A method according to claim 6 wherein the duration of said delay is predetermined to cause spins of a selected certain Larmor frequency to precess to said certain alignment.

8. A method for executing a frequency dependent plane rotation of magnetic spins in a sample under the influence of a spin aligning magnetic field $B_0$, comprising the steps of:

(a) providing a coil responsive to electrical energization to generate a $B_1$ field;

(b) orienting said coil so that the $B_1$ field generated by the coil has components transverse to said $B_0$ field; and (c) energizing said coil to generate a pulse which achieves a plane rotation of said spins using a discontinuous shift in the phase of the $B_1$ field where the plane rotation angle is determined by the magnitude of the discontinuous phase shift relative to said spins, said pulse generated to achieve said phase shift utilizing a predetermined delay between segments thereof to permit selected spins having a certain Larmor frequency to precess about said $B_0$ field a certain angle to realign them relative to the $B_1$ field so that they will undergo a plane rotation of a degree corresponding to said certain angle and wherein the spins having other than said certain Larmor frequency are subjected to plane rotations corresponding to the angle they have precessed during said delay so that a frequency dependent variable degree rotation is achieved.

9. A method for executing a frequency dependent plane rotation of selected magnetic spins in a sample under the influence of a spin aligning magnetic field $B_0$ comprising the steps of:

(a) providing a coil responsive to electrical energization to generate a $B_1$ field;

(b) orienting said col so that the $B_1$ field generated by said coil has components transverse to said $B_0$ field; and (c) energizing said coil to generate an RF pulse which achieves a plane rotation of said spins using a discontinuous shift in the phase of the $B_1$ field where the plane rotation angle is determined by the magnitude of the discontinuous phase shift relative to said spins, said pulse generated to achieve said phase shift utilizing a delay between segments thereof of a duration permitting spins having a certain Larmor frequency to precess about said $B_0$ field through a certain angle aligning them in a position at the end of said delay relative to said $B_1$ field which prevents them from undergoing said plane rotation and instead causing them to be returned to their initial alignment prior to said pulse so that a spin selective plane rotation is achieved.

10. A method for executing a frequency dependent plane rotation of magnetic spins in a sample under the influence of a spin aligning magnetic field $B_0$ comprising the steps of:

(a) providing a coil responsive to electrical energization to generate a $B_1$ field;

(b) orienting said coil so that the $B_1$ field generated by said coil has components transverse to said $B_0$ field; and (c) energizing said coil to provide an adiabatic pulse having at least two segments and which achieves a plane rotation of said spins using a discontinuous shift in the phase of the $B_1$ field where the plane rotation angle is determined by the magnitude of the discontinuous phase shift relative to said spins, said pulse generated to achieve said phase shift utilizing a delay between the segments to allow spins to precess to a new alignment under the influence of said $B_0$ field so that spins having a certain alignment relative to the $B_1$ field at the beginning of the segment following said delay undergo a plane rotation of a corresponding certain angle and spins which have other than said certain alignment are subjected to plane rotations of degrees corresponding to the angle they have precessed during said delay.

11. A method of slice selective excitation and signal acquisition from a sample under the influence of a spin aligning constant $B_0$ field comprising the steps of:

(a) superimposing a $B_0$ gradient on said $B_0$ field so that the frequency of spins vary with spatial location;

(b) providing a coil proximate said sample;

(c) exciting said surface coil to produce adiabatic excitation pulse to apply a $B_1$ field to said sample, said pulse generated to include an initial segment including a frequency sweep to cause the spins in said sample to rotate away from alignment with the $B_0$ field according to their resonance frequency within the $B_0$ gradient field, and a subsequent segment having a decaying $B_1$ amplitude with zero frequency modulation, said $B_1$ amplitude decaying according to a predetermined function to provide optimum $B_1$ insensitivity by spin-locking over as large a variation of $B_1$ magnitude as possible;

(d) reversing the $B_0$ gradient so that $B_0$ at each location becomes negative of its initial value and maintaining the reversed gradient sufficiently long to rephase spins dephased by the adiabatic pulse; and (e) turning off the $B_0$ gradient and acquiring the NMR signal from the sample.

* * * * *

UNITED STATES PATENT AND TRADEMARK OFFICE
CERTIFICATE OF CORRECTION

PATENT NO. : 4,947,119

DATED : August 7, 1990

INVENTOR(S) : Ugurbil, et al.

It is certified that error appears in the above-identified patent and that said Letters Patent is hereby corrected as shown below:

Column 4, Line 44, please delete "Be " and insert therefor --$B^e$--

Column 5, Lines 16 and 17 delete "aboves-pecified" and insert therefor --above-specified--

Column 6, line 38, please delete "Lamor" and insert therefor --Larmor--

Column 7, line 53, please delete "col" and insert therefor --coil--

Column 8, line 53, please delete "optimum" and insert therefor --optimal--

Signed and Sealed this

Seventeenth Day of March, 1992

Attest:

HARRY F. MANBECK, JR.

*Attesting Officer*     *Commissioner of Patents and Trademarks*

UNITED STATES PATENT AND TRADEMARK OFFICE
CERTIFICATE OF CORRECTION

PATENT NO. : 4,947,119
DATED : August 7, 1990
INVENTOR(S) : Kamil Ugurbil et al.

It is certified that error appears in the above-identified patent and that said Letters corrected as shown below:

Column 1, after the title, insert the following paragraph:

"This invention was made with government support under R01-HL-33600 and R01-HL 32427 awarded by the National Institutes of Health. The government has certain rights in the invention."

Signed and Sealed this

Twelfth Day of August, 1997

Attest:

BRUCE LEHMAN

*Attesting Officer*    Commissioner of Patents and Trademarks